US009000825B2

(12) United States Patent
van Liempd (10) Patent No.: US 9,000,825 B2
(45) Date of Patent: Apr. 7, 2015

(54) ACTIVE DIODE CIRCUIT (71) Applicant: Stichting IMEC Nederland, Eindhoven (NL)

(72) Inventor: Christinus Antonetta Paulus van Liempd, Schijndel (NL)

(73) Assignee: Stichting IMEC Nederland, Eindhoven (NL)

(*) Notice: Subject to any disclaimer, the term of this patent is extended or adjusted under 35 U.S.C. 154(b) by 0 days.

(21) Appl. No.: 14/082,094

(22) Filed: Nov. 15, 2013

(65) Prior Publication Data

US 2014/0176199 A1 Jun. 26, 2014

(30) Foreign Application Priority Data

Dec. 20, 2012 (EP) .................................... 12198411

(51) Int. Cl.
*H03K 5/08* (2006.01)
*H03L 5/00* (2006.01)
*H03K 3/012* (2006.01)
*H03K 17/06* (2006.01)
*H02M 1/00* (2006.01)

(52) U.S. Cl.
CPC ................ *H03K 3/012* (2013.01); *H03K 17/06* (2013.01); *H02M 2001/0009* (2013.01); *H03K 2217/0036* (2013.01)

(58) Field of Classification Search
USPC ................. 327/104, 313, 324, 310, 309, 306, 327/108–112, 427, 434, 437, 493; 361/111, 361/56, 91.1, 91.7; 363/127; 323/282
See application file for complete search history.

(56) References Cited

U.S. PATENT DOCUMENTS

| | | | |
|---|---|---|---|
| 6,292,046 B1* | 9/2001 | Ali | 327/310 |
| 6,407,594 B1 | 6/2002 | Milazzo et al. | |
| 6,597,587 B1 | 7/2003 | Poon et al. | |
| 2005/0218964 A1* | 10/2005 | Oswald et al. | 327/493 |
| 2009/0010033 A1 | 1/2009 | Deboy et al. | |
| 2009/0140707 A1 | 6/2009 | Deboy | |
| 2011/0304360 A1 | 12/2011 | Nakamura et al. | |

OTHER PUBLICATIONS

European Search Report, European Patent Application No. 12198411.6, dated Apr. 5, 2013.

* cited by examiner

*Primary Examiner* — Lincoln Donovan
*Assistant Examiner* — Thomas Skibinski
(74) *Attorney, Agent, or Firm* — McDonnell Boehnen Hulbert & Berghoff LLP (57) ABSTRACT

Various active diode circuits are described. In one example, there is provided an active diode circuit having an active diode and a control circuit. The active diode includes an anode terminal, a cathode terminal and a control terminal. The control circuit is configured to generate a control current of the active diode on the control terminal proportional to the diode current of the active diode. The control circuit is also configured to control the diode voltage of the active diode below a predetermined threshold.

15 Claims, 11 Drawing Sheets

ACTIVE DIODE CIRCUIT

CROSS-REFERENCE TO RELATED APPLICATIONS

This application claims priority to European Patent Application Serial No. 12198411.6 filed Dec. 20, 2012, the contents of which are hereby incorporated by reference in their entirety.

FIELD OF THE INVENTION

The invention relates to an active diode circuit. In particular, but not exclusively, it relates to a control circuit for controlling the control current and the diode voltage of an active diode.

BACKGROUND

Figure 1:
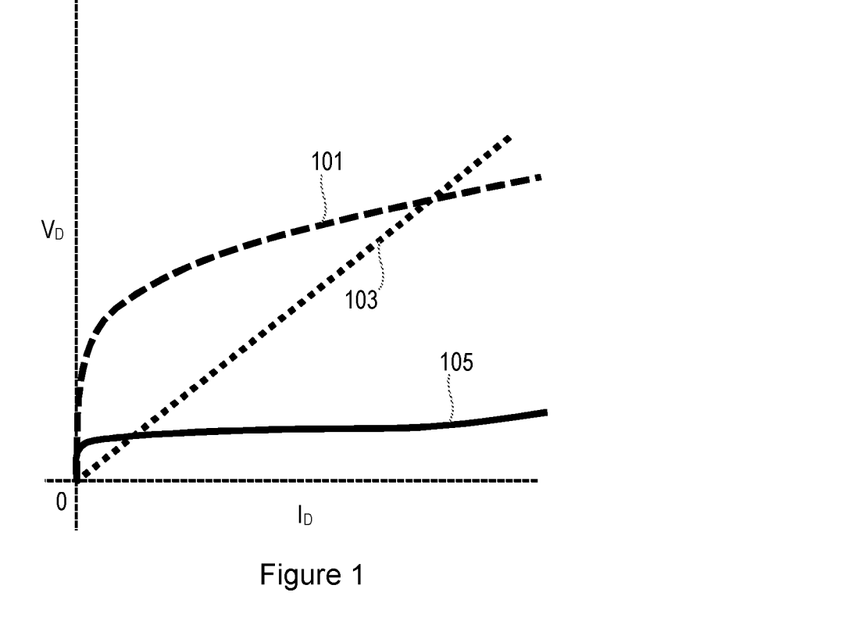
FIG. 1 is a graphical representation of the diode voltage against diode current for conventional diode, resistive switch and active diode.
Figure 2:
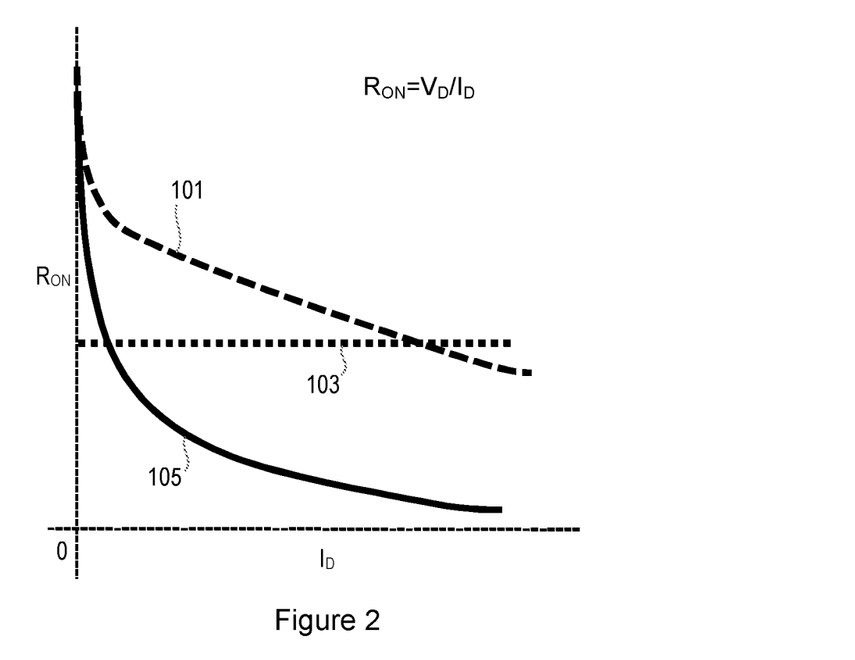
FIG. 2 is a graphical representation of the ON resistance of a conventional diode, resistive switch and an active diode.

A semiconductor diode conducts current in the forward direction. In the reverse direction, it blocks the current, apart from a small leakage current IL. In the forward direction, the voltage across the diode changes exponentially. For common semiconductor technologies, the forward voltage is, typically, greater than 500 mV over a large range of operating currents. As illustrated in FIG. 1, in a conventional diode, typically, the diode voltage changes with diode current as shown by the curve 101. For a resistive switch the ohmic relationship is shown by the line 103, i.e. constant resistance $R_{ON}$. Typical changes in the diode voltage with respect to the diode current of an active diode are shown by the curve 105. The power loss $P_{LOSS}$ defined as $P_{LOSS}=I_D V_D$ where $I_D$ is the diode current and $V_D$ is the diode voltage. As illustrated in FIG. 1, the diode voltage of an active diode is reduced over a large range of diode currents, thus greatly reducing the power loss of the diode. Further as illustrated in FIG. 2, the active diode (curve 105) has a much lower on resistance $R_{ON}$ and lower diode currents than that of a conventional diode (curve 101). As a result, the active diode provides diode provides for much lower active voltages and the power loss can be minimized.

Diodes are applied in several applications, for example, battery protection, rectification, and DC-DC conversion. In all these applications, $P_{LOSS}$ and $V_D$ play an important role in the operation and it is desirable that the power loss $P_{LOSS}$ and diode voltage, $V_D$ are minimized. Often Schottky diodes are applied for this reason, because $V_D$ is, invariably, lower (e.g. 300 mV) than common semiconductor diodes. Schottky diodes however exhibit a much larger leakage current in conduction in the reverse direction, making them less useful for ultra-low power devices, in particular for high temperature applications. It is common in DC-DC converters to replace the diodes with active MOS or bipolar switches which are used with additional control circuits for forward switching and reverse switching, for example, for zero voltage detection. There have been numerous approaches to minimize the power loss of a diode by active circuits for several applications. Mostly voltage drivers MOS switches are used driven with active amplifiers, voltage drivers or comparators which require biasing currents for operating in the reverse state. This results in decreased power efficiency, especially for low power applications. In addition such voltage driven MOS switches employ "hard" voltage switching of the power switch control gate. This results in too late or too early switching from forward to reverse and reverse to forward conditions for low forward currents due to the offset, which leads to decreased power efficiency.

Further, the resulting circuits are more complex. Therefore, the use of an active diode is becoming increasingly attractive for such applications.

SUMMARY

The present invention aims to provide a diode circuit which mitigates the above mentioned drawbacks minimizing the diode voltage, Vo. and hence the power loss, $P_{LOSS}$, with an order of magnitude whilst keeping similar reverse current to those of a common semiconductor diode.

According to an aspect of the present invention, there is provided an active diode circuit comprising: an active diode, the active diode comprising an anode terminal, a cathode terminal and a control terminal; a control circuit configured to generate a control current of the active diode on the control terminal proportional to the diode current of the active diode, and to control the diode voltage of the active diode below a predetermined threshold.

The control circuit may comprise a current mirror circuit connected across the anode or cathode and the control terminal to generate a control current of the active diode on the control terminal proportional to the diode current of the active diode.

The active diode may comprise: a first MOSFET of a first conductivity type; and a second MOSFET of the first conductivity type. The sources of the first and second MOSFETs are connected to form one of the anode and cathode of the active diode. The gate and drain of the first MOSFET are connected to the gate of the second MOSFET. The source and drain of the second MOSFET form the other one of the anode and cathode of the active diode, and the gate of the first MOSFET forms the control terminal of the active diode.

The aspect ratio of the first MOSFET may be selected to be above a second predetermined threshold value such that the ratio of the control current to the diode current is minimized. The control circuit may further comprise a third MOSFET of the first conductivity type, wherein the body of the third MOSFET is connected to the one of the anode and cathode of the active diode and the source of the third MOSFET is connected to the other of the anode and cathode of the active diode.

The aspect ratio of the second and third MOSFETs may be selected to provide a diode voltage below the first predetermined threshold. The gate of the third MOSFET may be connected to the control terminal of the active diode.

The current mirror may be connected across the control terminal of the active diode and the drain of the third MOSFET. The current mirror may comprise a fourth and fifth MOSFET of a second conductivity type.

The control circuit may further comprise a detector circuit configured to detect that the diode current of the active diode and the control current being generated is proportional to the detected diode current of the active diode. The detector may comprise a sixth MOSFET of the first conductivity type and a seventh MOSFET of the second conductivity type, the drain of the sixth MOSFET being connected to the drain of the seventh MOSFET, wherein the source of the sixth MOSFET is connected to the one of the anode and cathode of the active diode, the gate of the sixth MOSFET is connected to the drain of the sixth and seventh MOSFETs and the gate of the third MOSFET, the drain of the third and fourth MOSFETs is connected to the gate of the seventh MOSFET.

The active diode circuit of the present invention mimics a diode, having a greatly reduced forward voltage. It increases the efficiency of several integrated power management applications like AC-DC rectification, DC-DC converters and battery reversal protection.

BRIEF DESCRIPTION OF THE DRAWINGS

The invention will now be described, by way of example only, with reference to the following drawings, in which.

DETAILED DESCRIPTION

Examples of various types of active diodes are shown in FIGS. 3(a) to 3(d).

Figure 3A:
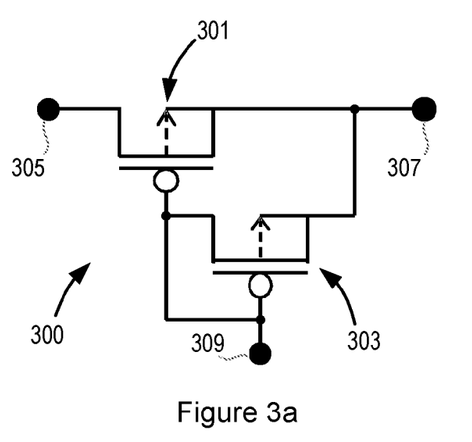
FIG. 3a is a circuit diagram of an active diode of a first type.

With reference to FIG. 3(a), a first active diode 300 comprises a first MOSFET 301 of a first conductivity type (in this example the first conductivity type is p-type) and a second MOSFET 303 of the first conductivity type. The gate and drain of the second pMOSFET 303 are connected to the gate of the first pMOSFET 301. The sources of the first and second pMOSFETs 301, 303 are connected together. The drain and source of the first pMOSFET 301 comprise the anode terminal 305 and the cathode terminal 307, respectively, of the first active diode 300. The gate of the second pMOSFET 303 comprises the control terminal 309 of the first active diode 300. The body (well diode) of the first pMOSFET 301 is connected to the source of the first pMOSFET 301 to obtain the same polarity as the active diode. The body of the second pMOSFET 303 is connected to its source forming a second diode connected between the gate and source of the first pMOSFET 301.

Figure 3B:
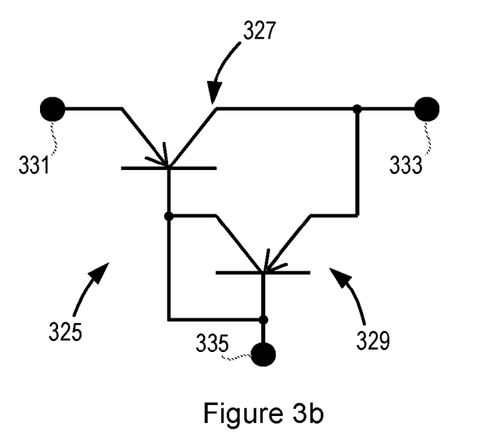
FIG. 3b is a circuit diagram of an active diode of a second type.

The active diode may also be implemented with PNP bipolar transistors 327, 329 as shown in FIG. 3(b) (a second active diode 325). The base of the second PNP bipolar transistor 329 comprises the control terminal 335 of the second active diode 325, the emitter of the first PNP transistor 327 comprises the anode terminal 331 of the second active diode 325, and the emitter of the second transistor 329 and the collector of the first transistor 327 comprise the cathode terminal 333 of the second active diode 325. The collector and base of the second transistor 329 are connected to the base of the first transistor 327.

Figure 3C:
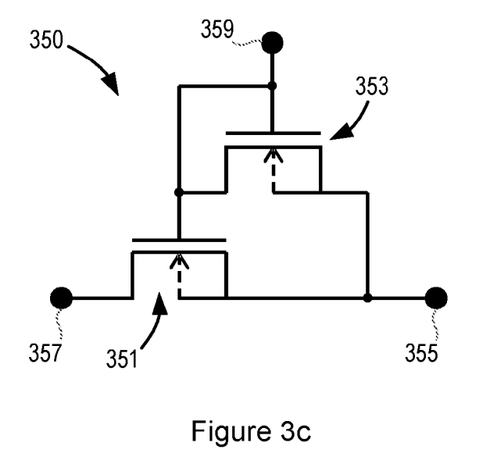
FIG. 3c is a circuit diagram of an active diode of a third type.
Figure 3D:
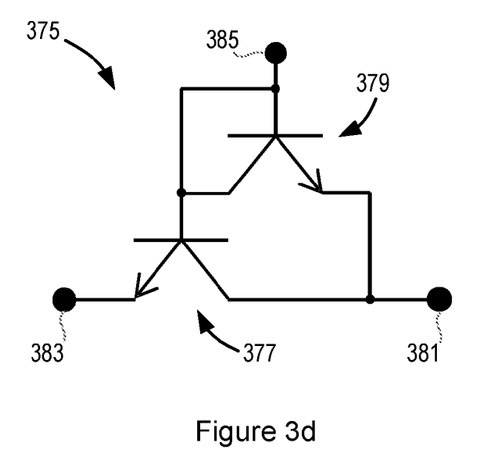
FIG. 3d is a circuit diagram of an active diode of a fourth type.

The active diode may also be implemented with nMOSFETs 351, 353 as shown in FIG. 3(c) (a third active diode 350) or with NPN transistors 377, 379 as shown in FIG. 3(d) (a fourth active diode 375).

As a result the gate/base of the first MOSFET/transistor 301, 327, 351, 377 becomes now current driven, where the control current $I_C$ defines the ON Resistance ($R_{ON}$) of the first MOSFET transistor 301, 327, 351, 377. This dual transistor structure employs controlled conduction of the first MOSFET/transistor 301, 327, 351, 377, enabling a diode like behavior of the first MOSFET/transistor 301, 327, 351, 377.

Figure 4:
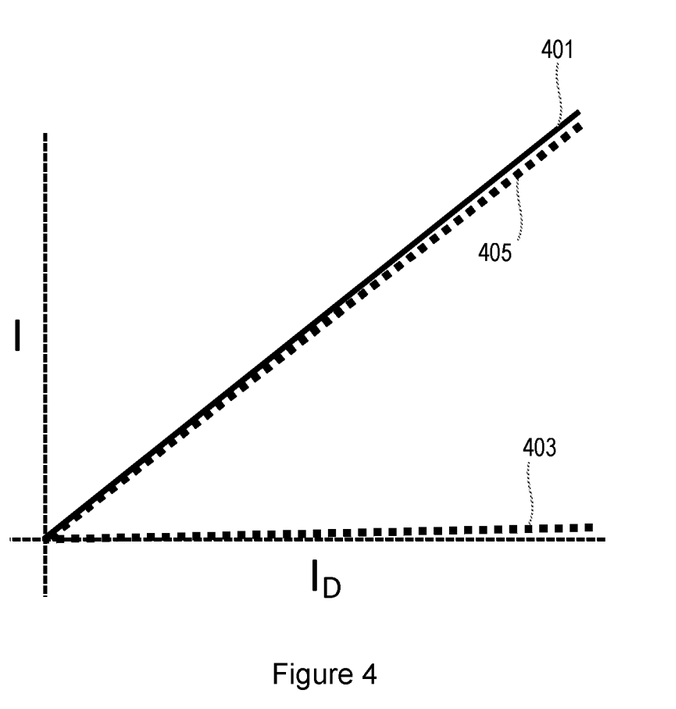
FIG. 4 is a graphical representation of the currents of the active diodes of FIGS. 3(a) to (d)

The active diode comprises two currents, with reference to the first active diode 300 of FIG. 3(a), the diode current $I_D$ which passes through the first MOSFET 301 and the control current $I_C$ which passes through the second MOSFET 303. These currents are illustrated graphically in FIG. 4. The diode current $I_D$ is shown by the line 401. The control current $I_C$ is illustrated by line 403. The difference $I_D$-$I_C$ is illustrated by line 405 which is the current on the cathode terminal 307.

To minimize $V_D$ and hence $P_{LOSS}$ of the first, second, third and fourth active diodes of FIGS. 3(a) to (d) with an order of magnitude while keeping similar reverse current of common semiconductor diodes, a control circuit 500, 525, 550, 575 is connected across the active diodes 300, 350, 325, 375, respectively as shown in FIGS. 5(a) to 5(d).

Figure 5A:
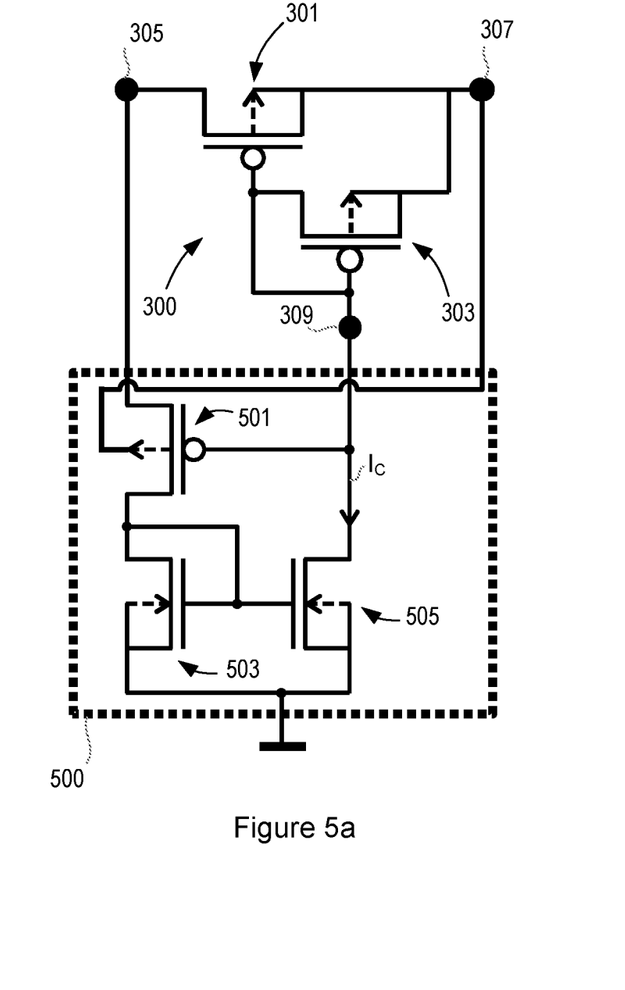
FIG. 5(a) is a circuit diagram of the active diode circuit of the first type according to a first embodiment of the present invention.

With reference to FIG. 5(a), the control circuit 500 comprises a current mirror circuit connected across the anode terminal 305, cathode terminal 307 and the control terminal 309 of the active diode 300 to generate a control current of the active diode on the control terminal 309 proportional to the diode current of the active diode 300. The control circuit 500 further comprises a third MOSFET 501 of the first conductivity type (p-type), wherein the body of the third MOSFET 501 is connected to the cathode terminal 307 of the first active diode 300 and the source of the third pMOSFET 501 is connected to the anode terminal 305 of the first active diode 300. The current mirror circuit comprises a fourth MOSFET 503 of a second conductivity type (n-type) having its gate connected to the gate of a fifth nMOSFET 505. The drain of the fifth nMOSFET 505 is connected to the gate of the third pMOSFET 501 and the control terminal 309 of the first active diode 300. The sources of the fourth and fifth nMOSFETs are connected to ground. The drain of the fourth nMOSFET 503 and the gates of the fourth and fifth nMOSFETs 503, 505 are connected to the drain of the third pMOSFET 501.

Figure 5B:
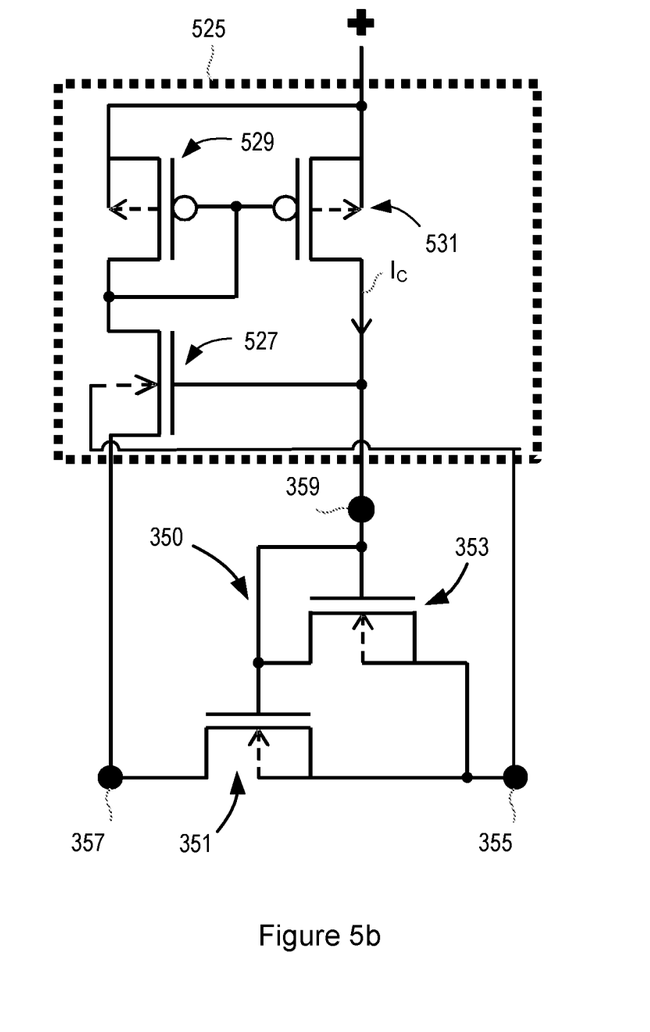
FIG. 5(b) is a circuit diagram of the active diode circuit of the second type according to the first embodiment of the present invention.

FIG. 5(b) illustrates the control circuit 525 for the third active diode 350 of FIG. 3(c). In contrast to that of FIG. 5(a), the current mirror circuit comprises a fourth and fifth pMOSFETs 529, 531 in which their source are connected to a supply voltage. The third nMOSFET 527 has a source connected to the cathode terminal 357 of the third active diode 350, a gate connected to the control terminal 359 of the third active diode 350 and the drain of the fifth pMOSFET 531, the body of the third nMOSFET 527 is connected to the cathode terminal 355 of the third active diode 350 and the drain of the third nMOS- FET 527 is connected to the gates of the third and fourth pMOSFETs 529, 531 of the current mirror circuit.

Figure 5C:
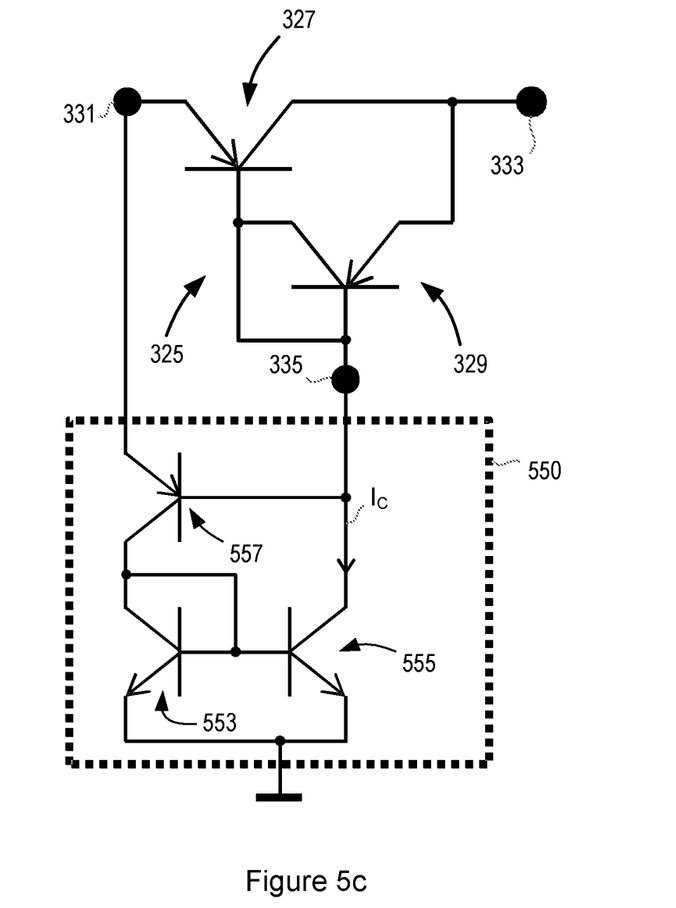
FIG. 5(c) is a circuit diagram of the active diode circuit of the third type according to the first embodiment of the present invention.

FIG. 5(c) illustrates the control circuit 550 for the second active diode 325 of FIG. 3(b). In contrast to that of FIG. 5(a), the current mirror circuit comprises a fourth and fifth NPN transistors 553, 555 in which their emitters are connected to ground. A third PNP transistor 551 has an emitter connected to the cathode terminal 331 of the second active diode 325, a base connected to the control terminal 335 of the second active diode 325 and the collector of the fifth NPN transistor 555 and a collector connected to the collector of the fourth NPN transistor 553 and the gates of the third and fourth NPN transistors 553, 555 of the current mirror circuit.

Figure 5D:
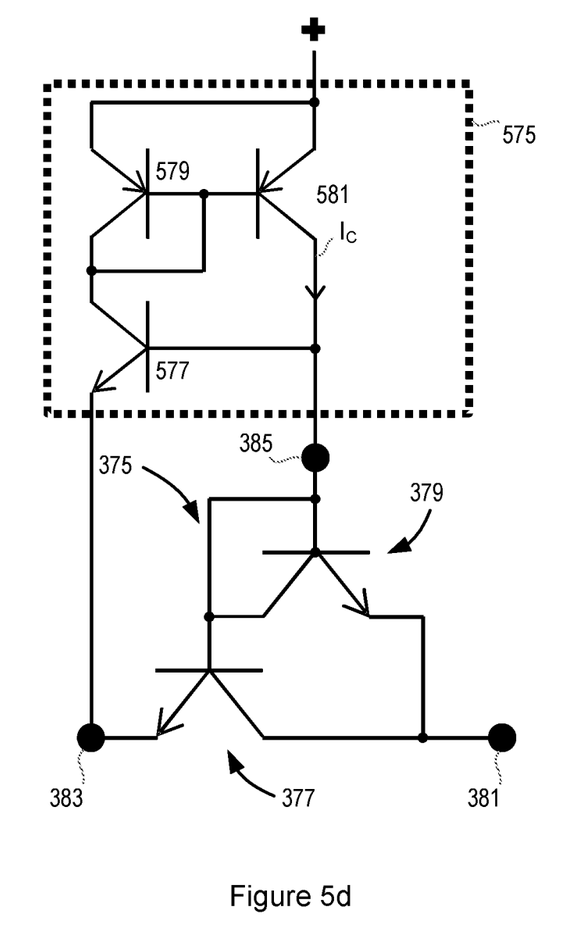
FIG. 5(d) is a circuit diagram of the active diode circuit of the fourth type according to the first embodiment of the present invention.

FIG. 5(d) illustrates the control circuit 575 for the fourth active diode 375 of FIG. 3(d). In contrast to that of FIG. 5(a), the current mirror circuit comprises a fourth and fifth PNP transistors 579, 581 in which their emitters are connected to a supply voltage. A third NPN transistor 577 has an emitter connected to the cathode terminal 383 of the fourth active diode 375, a base connected to the control terminal 385 of the fourth active diode 375 and the collector of the fifth NPN transistor 577 and a collector connected to the collector of the collector of the fourth PNP transistor 579 and the gates of the third and fourth PNP transistors 579, 581 of the current mirror circuit.

Figure 6A:
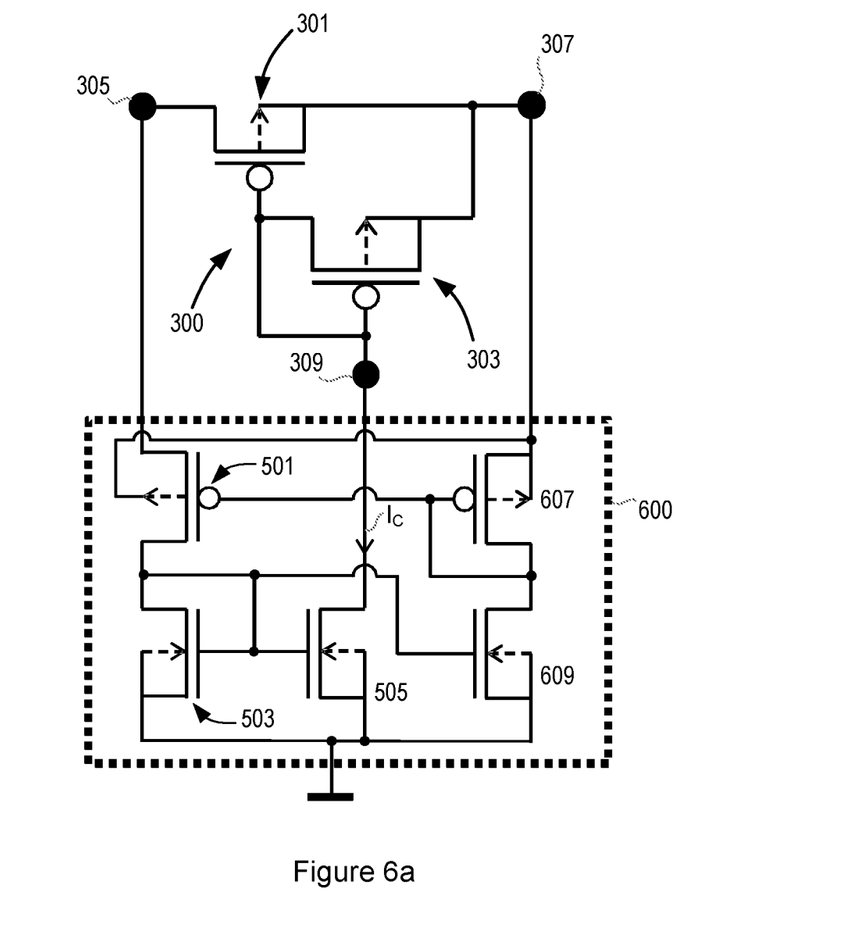
FIG. 6(a) is a circuit diagram of the active diode circuit of a first type according to a second embodiment of the present invention.
Figure 6B:
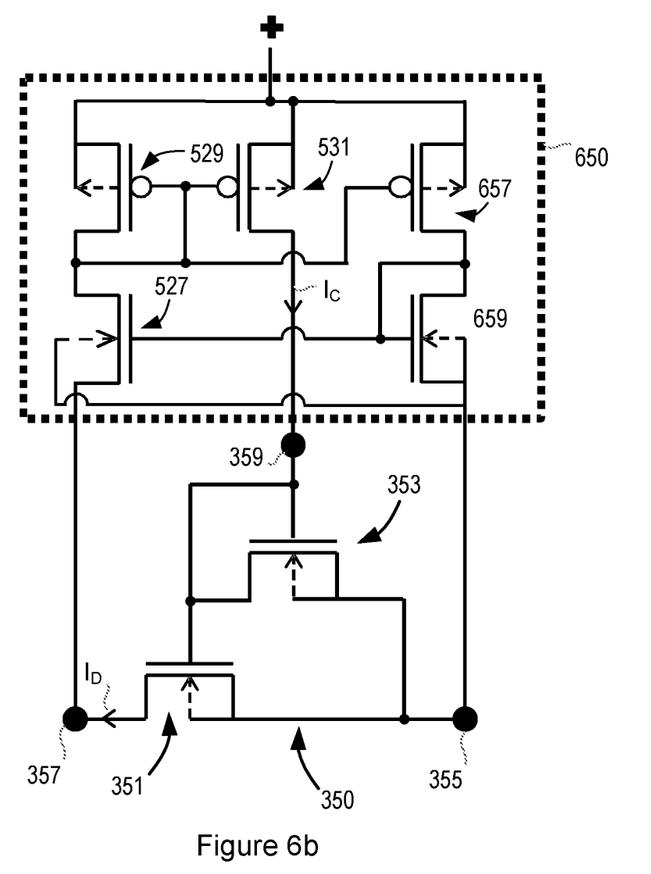
FIG. 6(b) is a circuit diagram of the active diode circuit of a second type according to a second embodiment of the present invention.

Alternative embodiments of the control circuit of FIGS. 5(a) and 5(b) are shown in FIGS. 6(a) and 6(b).

With reference to FIG. 6(a), the control circuit 600 further comprises a detector circuit comprising a sixth pMOSFET 607 and a seventh nMOSFET 609. The drain of the sixth pMOSFET 607 is connected to the drain of the seventh nMOSFET 609, wherein the source of the sixth pMOSFET 607 is connected to the cathode 307 of the first active diode 300. The gate of the sixth pMOSFET 607 is connected to the drain of the sixth and seventh MOSFETs 607, 609 and the gate of the third MOSFET 501 of control circuit 500 of FIG. 5(a). The drain of the third and fourth MOSFETs 503, 505 is connected to the gate of the seventh MOSFET 609. The body of the sixth pMOSFET 607 is connected to its source and the body of the third pMOSFET 501.

With reference to FIG. 6(b), the control circuit 650 comprises a detector circuit comprising a sixth pMOSFET 657 and a seventh nMOSFET 659. The drain of the sixth pMOSFET 657 is connected to the drain of the seventh nMOSFET 659. The body and source of the sixth pMOSFET 657 are connected to the voltage supply. The gate of the sixth pMOSFET 657 is connected to the gates of the fourth and fifth pMOSFETS 529,531 of the control circuit 525 of FIG. 5(b) and the drain of the fourth pMOSFET 529. The gate of the seventh nMOSFET 659 is connected to its drain and the gate of the third nMOSFET 527 of the control circuit 525 of FIG. 5(b). The body of the seventh nMOSFET 659 is connected to the anode terminal 355 of the third active diode 350.

The function of the control circuit is to drive the control current $I_C$ to be proportional with diode current $I_D$, while keeping the voltage difference $V_D$ across the first MOSFET below a first predetermined threshold, e.g. 35 mV, such that the first transistor 301, 327, 351, 377 is in the triode mode. If the active diode is in reverse all biasing currents to the control circuits 500, 525, 550, 575, 600, 650 will be zero. The proportionality factor $I_C/I_D$ is chosen (as described in more detail below) to be below a second predetermined threshold e.g. 0.003 to enable a high power efficiency.

The control circuits 600, 650 of FIGS. 6(a) and 6(b) show an enhancement to increase switching speed. They use a separate circuit using the fifth MOSFET 505, 531 to generate $I_C$ but isolated from the detecting circuit of the sixth and seventh MOSFETS 607,609, 657, 659. In this way the detecting current transitions are faster because of the large gate of the first MOSFET 301, 351 required to achieve the required ratio of the control current and diode current which results in large parasitic capacitances.

The ratio $I_C/I_D$ and $V_D$ are controlled for DC and low frequencies as a function of the aspect ratio of the first, second and third MOSFETs (the aspect ratio, K=W/L wherein W is the gate width and L is the gate length).

In a forward conducting condition:

In an example $K_4=K_5$, $K_2>K_3$, $I_D>0$, wherein $K_1$, $K_2$, $K_3$, $K_4$, $K_5$ are the aspect ratios of the first, second, third, fourth and fifth transistors, respectively. The first transistor is in the triode mode and the third transistor is in saturation. The backgate effect of the first and second transistors is ignored and all the transistors comprise the same technology, such that the ratio of the control current and the diode current is $$\frac{I_C}{I_D} = \left(\frac{K_3}{K_1}\right)\frac{K_2}{K_2 - K_3} \quad [1]$$

for transistors in weak inversion, and the voltage diode is $$|V_D| = U_T \ln\left(\frac{K_2}{K_3}\right) \quad [2]$$

for transistors in weak inversion, wherein $U_T$ is the thermal voltage, defined as kT/q (k is Boltzmann constant, T is absolute temperature and q is charge of electron) of the transistors, and such that the ratio of the control current and the diode current is $$\frac{I_C}{I_D} = \left(\frac{K_3}{2K_1}\right)\frac{\sqrt{K_2}}{\sqrt{K_2} - \sqrt{K_3}} \quad [3]$$

for transistors in strong inversion, and the voltage diode is $$|V_D| = \sqrt{\frac{\left(\sqrt{\frac{K_2}{K_3}} - 1\right)I_D}{K_1 \beta}} \quad [4]$$

for transistors in strong inversion, wherein $\beta=\mu C_{OX}$, wherein $\mu$ is the mobility of electrons (in case of NMOS active diode) or holes (in case of PMOS active diode) and $C_{OX}$ is the gate capacitance per square meter of the semiconductor technology.

In a reverse condition, negative $V_D$:

$$I_C = I_D = 0 \quad [5]$$

having no leakage current.

Although in the example above $K_4=K_5$, it can be appreciated the ratio $K_4/K_5$ is not limited to 1. Other ratios can also be utilized.

Figure 7:
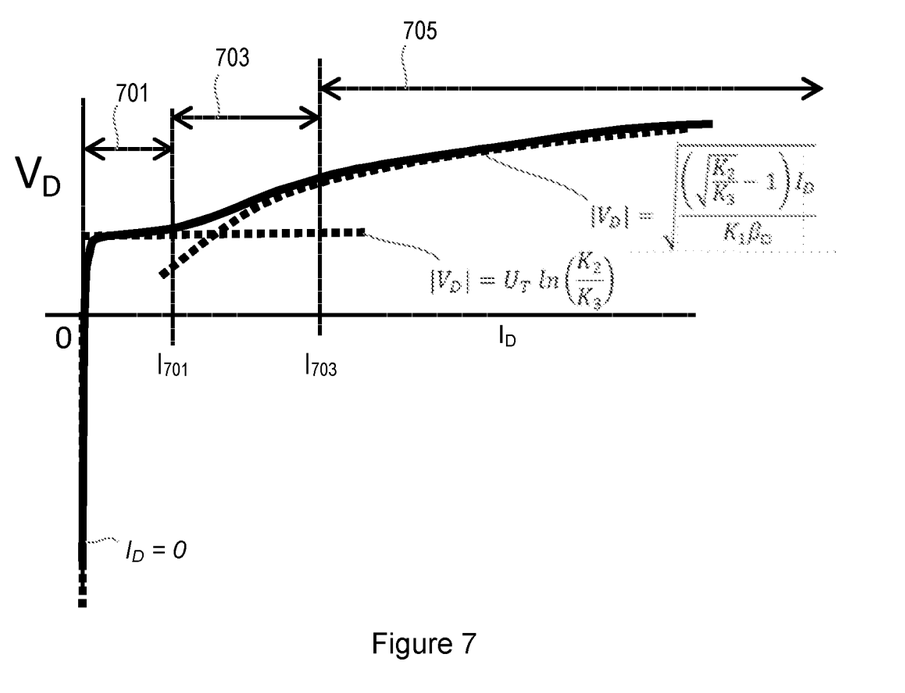
FIG. 7 is a graphical representation of the diode voltage versus diode current of the active diode circuit of the embodiments of the present invention.

These equations are shown graphically in FIG. 7. As clearly illustrated in FIG. 7, for $I_D<I_{701}$, the transistors operate in weak inversion and $V_D$ is constant as provided by Equations [1] and [2] above. For $I_D>I_{705}$, the transistors operate in strong inversion and $V_D$ is proportional to the square root of $I_D$ as provided by Equations [3] and [4]. For $I_{701}<I_D<I_{705}$, the transistors operate in moderate inversion and $V_D$ is in transition from the weak inversion to strong inversion. Although not shown in the drawings, the circuit of FIG. 8 could easily be realized for the control circuit 525 of FIG. 5(b).

Therefore, in order to achieve a ratio of the control current and diode current below a second predetermined threshold i.e. as low as possible, $K_1$ is made as large as possible within design constraints of the size of the first transistor. Further the ratio of $K_2$ and $K_3$ is controlled to provide the voltage diode below a first predetermined threshold.

Figure 8:
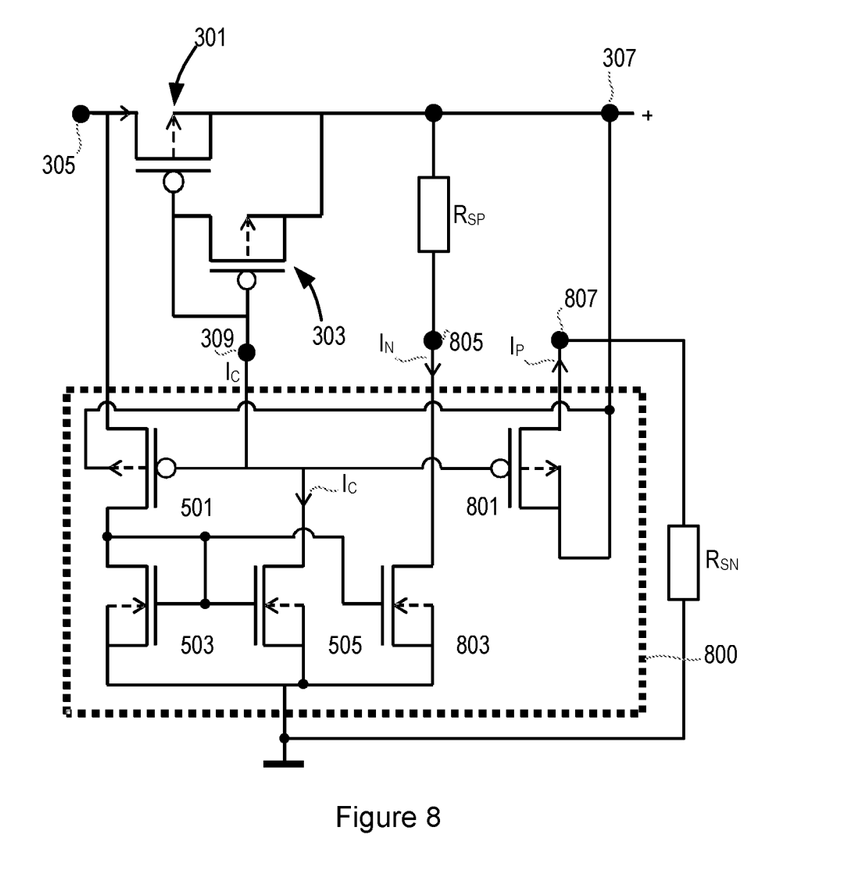
FIG. 8 is circuit diagram of an application of the active diode circuit for a current source and/or sink.

FIG. 8 illustrates an example of an application 800 of the active diode circuit of FIG. 5(a) to provide a current source $I_P$ voltage source $V_{SN}$ across the resistor $R_{SN}$ and a current sink $I_N$ or voltage $V_{SP}$ across the resistor $R_{SP}$. The current sink at the first current terminal 805 is connected to the drain of a ninth nMOSFET 803. The body and source of the ninth nMOSFET 803 are connected to ground. The gate of the ninth nMOSFET 803 is connected to the gates of the fourth and fifth nMOSFET 503, 505 of the control circuit 500 of FIG. 5(a). The current source at the second current terminal 807 connected to the resistor R SN is connected to the drain of an eighth pMOSFET 801. The gate of the eighth pMOSFET 801 is connected to the gate of the third pMOSFET 501 of the control circuit 500 of FIG. 5(a). The body and source of the eighth pMOSFET 801 are connected to the cathode terminal 307 of the first active diode 300.

The control circuit can be easily extended as shown in FIG. 8 to generate diode current monitor outputs (sinking and/or sourcing), which are scaled versions of the diode current $I_D$. This is beneficial for use in several applications: battery current monitoring; vibration energy harvesters, to be used as a sensor while harvesting, and; synchronized switching of the active diodes in the voltage doubling rectifier and bridge rectifier topologies.

Further, to improve the speed of the forward to reverse transition a scaled, delayed (by using a capacitor) and inverted current Ix can be added to $I_C$.

Although embodiments of the present invention have been illustrated in the accompanying drawings and described in the foregoing detailed description, it will be understood that the invention is not limited to the embodiments disclosed, but capable of numerous modifications without departing from the scope of the invention as set out in the following claims. In the claims, the word "comprising" does not exclude other elements or steps, and the indefinite article "a" or "an" does not exclude a plurality. Any reference signs in the claims should not be construed as limiting the scope.

What is claimed is:

1. An active diode circuit comprising:
   an active diode, the active diode comprising an anode terminal, a cathode terminal, a control terminal, a first MOSFET of a first conductivity type, and a second MOSFET of the first conductivity type, wherein a source of the first MOSFET and a source of the second MOSFET are connected to form one of the anode terminal and cathode terminal of the active diode, a gate and a drain of the first MOSFET are connected to a gate of the second MOSFET, a source and a drain of the second MOSFET form the other one of the anode terminal and cathode terminal of the active diode, and the gate of the first MOSFET forms the control terminal of the active diode; and
   a control circuit configured to generate a control current of the active diode on the control terminal proportional to a diode current of the active diode, and to control the diode voltage of the active diode below a first predetermined threshold, wherein the control circuit comprises:
   a current mirror circuit connected across the anode terminal or cathode terminal and the control terminal to generate a control current of the active diode on the control terminal proportional to the diode current of the active diode, and
   a third MOSFET of the first conductivity type, wherein a body of the third MOSFET is connected to the one of the anode terminal and cathode terminal of the active diode, and a source of the third MOSFET is connected to the other of the anode terminal and cathode terminal of the active diode.

2. The active diode circuit according to claim 1, wherein an aspect ratio of the first MOSFET is selected to be above a second predetermined threshold value such that a ratio of the control current to the diode current is minimized.

3. The active diode circuit according to claim 1, wherein an aspect ratio of the second MOSFET and an aspect ratio of the third MOSFET are selected to provide a diode voltage below the first predetermined threshold.

4. The active diode circuit according to claim 1, wherein the current mirror is connected across the control terminal of the active diode and a drain of the third MOSFET.

5. The active diode circuit according to claim 1, wherein a gate of the third MOSFET is connected to the control terminal of the active diode.

6. The active diode circuit according to claim 1, wherein the control circuit further comprises a detector circuit configured to detect that the control current being generated is proportional to a detected diode current of the active diode.

7. The active diode circuit according to claim 6, wherein the current mirror comprises a fourth MOSFET of a second conductivity type and a fifth MOSFET of the second conductivity type.

8. The active diode circuit according to claim 7, wherein the detector comprises a sixth MOSFET of the first conductivity type and a seventh MOSFET of the second conductivity type, a drain of the sixth MOSFET being connected to a drain of the seventh MOSFET, wherein a source of the sixth MOSFET is connected to the one of the anode terminal and cathode terminal of the active diode, a gate of the sixth MOSFET is connected to the drain of the sixth MOSFET and the drain of the seventh MOSFETs and the gate of the third MOSFET, and the drain of the third MOSFET and a drain of the fourth MOSFET are connected to a gate of the seventh MOSFET.

9. A current circuit comprising:
   an active diode circuit, the active diode circuit comprising:
   an active diode, the active diode comprising an anode terminal, a cathode terminal a control terminal, a first MOSFET of a first conductivity type, and a second MOSFET of the first conductivity type, wherein a source of the first MOSFET and a source of the second MOSFET are connected to form one of the anode terminal and cathode terminal of the active diode, a gate and a drain of the first MOSFET are connected to a gate of the second MOSFET, a source and a drain of the second MOSFET form the other one of the anode terminal and cathode terminal of the active diode, and the gate of the first MOSFET forms the control terminal of the active diode, and
   a control circuit configured to generate a control current of the active diode on the control terminal proportional to a diode current of the active diode, and to control the diode voltage of the active diode below a first predetermined threshold, wherein the control circuit comprises:
   a current mirror circuit connected across the anode terminal or cathode terminal and the control terminal to generate a control current of the active diode on the control terminal proportional to the diode current of the active diode, and
a third MOSFET of the first conductivity type, wherein a body of the third MOSFET is connected to the one of the anode terminal and cathode terminal of the active diode, and a source of the third MOSFET is connected to the other of the anode terminal and cathode terminal of the active diode.

10. The current circuit of claim 9:
wherein the control circuit further comprises a detector circuit configured to detect that the control current being generated is proportional to a detected diode current of the active diode,
wherein the current mirror comprises a fourth MOSFET of a second conductivity type and a fifth MOSFET of the second conductivity type, and
wherein the detector comprises a sixth MOSFET of the first conductivity type and a seventh MOSFET of the second conductivity type, a drain of the sixth MOSFET being connected to a drain of the seventh MOSFET, wherein a source of the sixth MOSFET is connected to the one of the anode terminal and cathode terminal of the active diode, a gate of the sixth MOSFET is connected to the drain of the sixth MOSFET and the drain of the seventh MOSFETs and the gate of the third MOSFET, and the drain of the third MOSFET and a drain of the fourth MOSFET are connected to a gate of the seventh MOSFET.

11. The current circuit of claim 9, wherein the current circuit comprises a current source.

12. The current circuit of claim 11, further comprising a MOSFET of the first conductivity type mirroring the third MOSFET to generate a current proportional to the diode current of the active diode.

13. The current circuit of claim 9, wherein the current circuit comprises a current sink.

14. The current circuit of claim 13, further comprising a MOSFET of the second conductivity type connected across the current mirror circuit to sink a current proportional to the diode circuit.

15. An electronic device comprising:
an active diode circuit comprising:
an active diode, the active diode comprising an anode terminal, a cathode terminal, a control terminal, a first MOSFET of a first conductivity type, and a second MOSFET of the first conductivity type, wherein a source of the first MOSFET and a source of the second MOSFET are connected to form one of the anode terminal and cathode terminal of the active diode, a gate and a drain of the first MOSFET are connected to a gate of the second MOSFET, a source and a drain of the second MOSFET form the other one of the anode terminal and cathode terminal of the active diode, and the gate of the first MOSFET forms the control terminal of the active diode; and
a control circuit configured to generate a control current of the active diode on the control terminal proportional to a diode current of the active diode, and to control the diode voltage of the active diode below a first predetermined threshold, wherein the control circuit comprises:
a current mirror circuit connected across the anode terminal or cathode terminal and the control terminal to generate a control current of the active diode on the control terminal proportional to the diode current of the active diode, and
a third MOSFET of the first conductivity type, wherein a body of the third MOSFET is connected to the one of the anode terminal and cathode terminal of the active diode, and a source of the third MOSFET is connected to the other of the anode terminal and cathode terminal of the active diode.

* * * * *